United States Patent [19]

Bai et al.

[11] Patent Number: 4,581,507

[45] Date of Patent: Apr. 8, 1986

[54] IMPACT SWITCH

[75] Inventors: Monty W. Bai, Scottsdale; Roderick J. Miller, Chandler; Thomas D. Petty, Tempe, all of Ariz.

[73] Assignee: Motorola, Inc., Schaumburg, Ill.

[21] Appl. No.: 686,556

[22] Filed: Dec. 26, 1984

[51] Int. Cl.[4] .......................... H01H 35/14; H01L 41/08

[52] U.S. Cl. .......................... 200/61.45 R; 200/61.48; 200/61.51

[58] Field of Search .................. 200/5 A, 61.45–61.53, 200/83 N; 310/329, 368, 339; 84/1.14

[56] References Cited

U.S. PATENT DOCUMENTS

| | | | |
|---|---|---|---|
| 3,158,705 | 11/1964 | Bliss | 200/61.45 R |
| 3,267,233 | 8/1966 | Basite et al. | 200/83 N |
| 3,538,232 | 11/1970 | Bachtig et al. | 84/1.14 |
| 3,786,758 | 1/1974 | Zimmerman | 200/61.08 |
| 3,879,586 | 4/1975 | DuRocher et al. | 200/5 A |
| 3,968,336 | 7/1976 | Johnson | 200/5 A |
| 4,135,067 | 1/1979 | Bitko | 200/61.52 |

*Primary Examiner*—J. R. Scott

*Attorney, Agent, or Firm*—Raymond J. Warren

[57] ABSTRACT

An apparatus and method is disclosed for providing an impact switch that is non-critical to temperature variations and preload pressures. The impact switch consists of a plate having a pair of parallel slots disposed therethrough defining a beam capable of flexing. A mass is located on the beam. The plate is covered by a housing having a groove disposed therein and a pin extending through the cover and into the groove. The cover is placed such that the groove is disposed above the beam. When the required force is exerted on the beam it will flex causing the mass and pin to come in contact thereby completing a circuit. The force required to make contact can be varied by changing the mass and/or the material or dimension of the beam.

14 Claims, 5 Drawing Figures

IMPACT SWITCH

BACKGROUND OF THE INVENTION

1. Field of the Invention

This invention relates, in general, to impact switches and, more particularly, to beam type impact switches.

2. Background Art

Various types of impact switches are known in the art. These types of switches have varied and numerous uses such as to detect automobile impact. Among existing impact switches, problems arise either with preload pressures, temperature variations or both. If the impact switch is strong enough to compensate for preload pressure it is often made two strong resulting in a failure to operate when needed. In addition, many of the existing impact switches are incapable of being adjusted to provide contact at varying impact forces.

SUMMARY OF THE INVENTION

Accordingly, it is an object of the present invention to provide an impact switch and method of operation that will overcome the deficiencies of the prior art.

Another object of the present invention to provide an impact switch and method of operation that is not temperature dependent.

A further object of the present invention is to provide an impact switch and method of operation that is not dependent on preload pressure.

Still another object of the present invention is to provide an impact switch that has a low profile.

Yet another object of the present invention is to provide an impact switch that has adjustable impact load settings.

The above and other objects and advantages of the present invention are provided by an impact switch and method of operation whereby a weighted element is placed on a flexable beam. The beam will flex sufficiently to make contact, completing an electrical circuit when the appropriate inertial load is applied thereto. The entire switch is then embodies in a printed circuit board.

A particular embodiment of the present invention consists of a plate having a pair of parallel slots disposed therethrough defining a beam capable of flexing. A mass is located on the beam. The plate is covered by a housing having a groove disposed therein and a pin extends through the cover and into the groove. The cover is placed such that the groove is disposed above the beam. When the required force is exerted on the beam it will flex causing the mass and pin to come in contact thereby completing a circuit. The force required to make contact can be varied by changing the mass and/or the material or dimension of the beam.

DETAILED DESCRIPTION OF THE INVENTION

Figure 1:
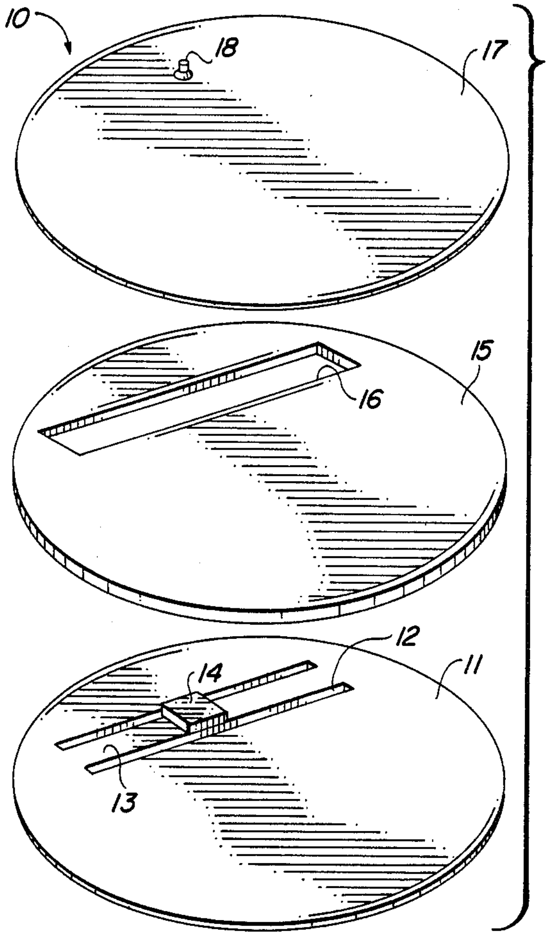
FIG. 1 is an exploded view in perspective of an impact switch embodying the present invention.

Referring to FIG. 1, an exploded view in perspective of an impact switch, generally designated 10, is illustrated embodying the present invention. Switch 10 consists of a plate 11 having a pair of parallel slots 12 extending therethrough defining a beam 13. Beam 13 has a mass 14 mounted thereon. Plate 11, beam 13 and mass 14 are made of a conductive material, such as beryllium copper or the like. The width and material of beam 13; and the weight of mass 14 may be varied to provide the desired resistance of beam 13 to deflection upon encountering an impact force. The width of plate 11 is approximately 0.004" thick and approximately 0.5" in diameter. Beam 13, as illustrated here, has the dimensions of 0.004"×0.075"×0.4".

A spacer 15 having a hole 16, which aligns with beam 13, is placed over plate 11. Space 15 is a nonconductive material and may be a printed circuit board or the like. Hole 16 allows beam 13 and mass 14 to extend therethrough when deflected. A cover 17 having a pin 18 extending therethrough is placed over spacer 15 such that pin 18 extends into hole 16. Cover 17 and pin 18 are made of conductive material such as copper or the like.

When sufficient force is applied to beam 13, in a direction perpendicular to plate 11, beam 13 will flex causing mass 14 to contact pin 18 through hole 16 thereby completing an electrical circuit from plate 11 to cover 17. Plate 11, containing beam 13, would be placed on one surface of a printed circuit board 15 and cover 17 would be placed on the opposite side. Printed circuit board 15 would thus provide the space needed between mass 14 and pin 18. This then provides a low profile switch that may be incorporated on a printed circuit board with other electrical components.

Figure 2:
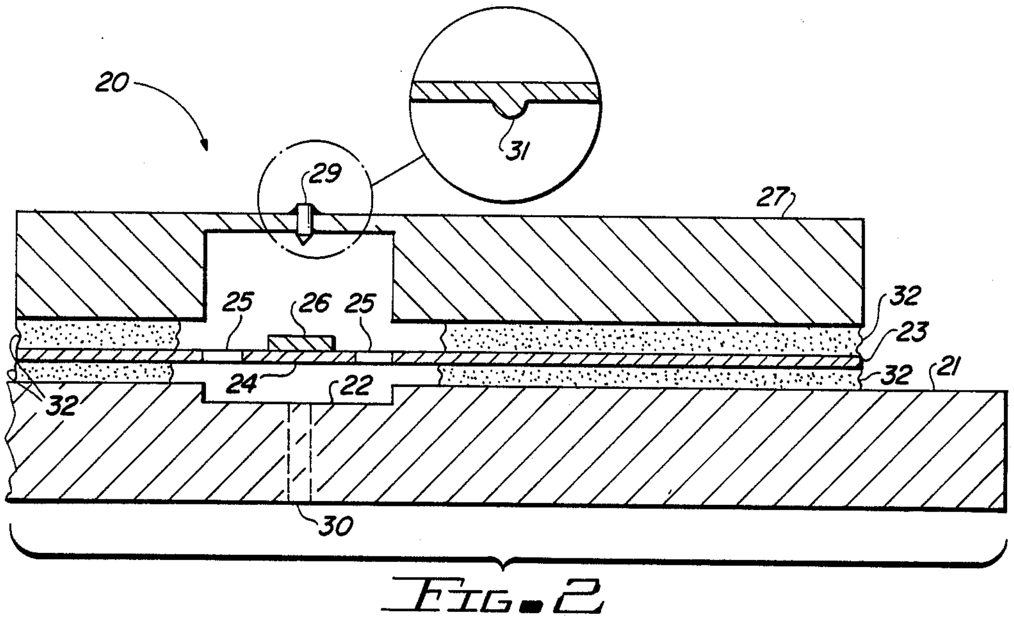
FIG. 2 is a cross sectional view of an impact switch embodying the present invention.

Referring now to the diagram of FIG. 2, a cross-sectional view of an impact switch, generally designated 20, illustrates a second embodiment of the present invention. Switch 20 consists of a base 21 having a groove 22 disposed therein. A plate 23 is bonded to base 21 by a bonding/insulating layer 32 to isolated the input from the output of switch 20. Plate 23 has a beam 24 defined by a pair of slots 25 extending through plate 23. Mounted on beam 24 is a mass 26. Mounted to plate 23 by a second bonding/insulating layer 32 is a cover 27 having a groove 28 therein. A pin 29 is mounted through cover 27 and extends into opening 28.

Due to the differing physical properties of bonding-/insulating layers 32, the distance between mass 26 and pin 29 may vary causing contact at differing impact forces. To maintain a uniform distance between mass 26 and pin 29, a hole 30 is provided extending through base 21 to a groove 22. A rod, such as that of a micrometer, may then be inserted through hole 30 and push beam 24 and mass 26 to a height where mass 26 should contact pin 29. Pin 29 is lowered through a hole in cover 27 until it contacts mass 26. Pin 29 is then secured in place and the rod extending through hole 30 is removed returning beam 24 and mass 26 to their original positions. Hole 30 may then be sealed and any excess pin 29 extending out of cover 27 may be removed. Should the distance between pin 29 and mass 26 not be of significant importance, the hole 30 need not be provided and pin 29 may be replaced with a detent 31 formed in cover 27. Under cetain conditions pin 29 may be eliminated allowing mass 26 to contact cover 27, thereby completing the circuit.

Figure 3:
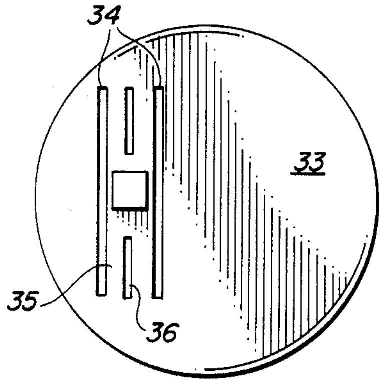
FIG. 3 is a top view of an impact switch embodying the present invention.

Referring now to FIG. 3, a top view of an impact switch, generally designated 33, embodying the present invention is illustrated. Switch 33 has a pair of parallel slots 34 defining a beam 35. Beam 35 is illustrated having a pair of slots 36 disposed between and parallel to slots 34. Slots 36 are provided to reduce the frequency of beam 35 without losing torsional stiffness. Since impact switches are often contained in objects that are subject to vibration it is possible that a frequency be created that will cause beam 35 to vibrate. Slots 36 prevent this vibration in beam 35. It should be noted that slots, such as slots 36, need not be used; and that various geometric openings placed in beam 35 will cause differing changes in the frequency.

Figure 4:
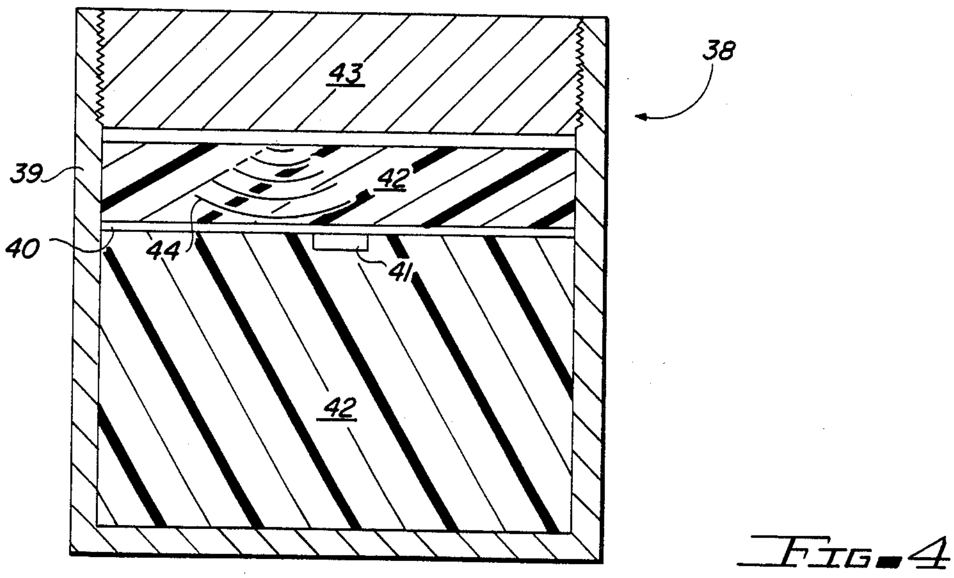
FIG. 4 PRIOR ART
FIG. 4 is a cross-sectional view of a prior art impact switch.

Referring now to FIG. 4, a cross-sectional view of a prior art impact switch, generally designated 38, is illustrated. Switch 38 has a housing 39 containing a printed circuit board 40 having a piezoelectric crystal 41 mounted thereon. Printed circuit board 40 is encased in a plastic 42. Above plastic 42 is a screw 43 that is used to apply a preload pressure to crystal 41. Upon impact, a shock wave travels through plastic 42 in the direction shown by arrow 44. This causes compression of crystal 41 which generates an electrical voltage proportional to the compression.

The disadvantage of prior art switch 38 is derived from the materials utilized. The physical properties of plastic 42 will vary greatly with changes in exterior condition. Changes in temperature will vary the force needed to generate the desired current in crystal 41. In addition the prior art device is subject to preload pressure. As screw 43 is tightened the pressure on crystal 41 increses causing an increase in the voltage, thereby changing the force required to reach the setoff level.

Figure 5:
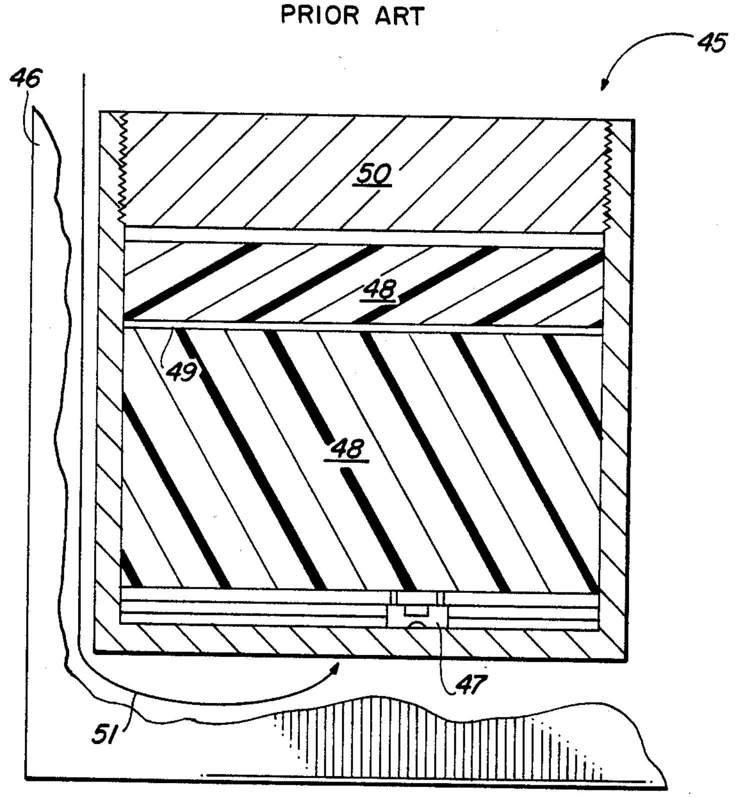
FIG. 5 is a cross-sectional view of an impact switch embodying the present invention.

Referring now to FIG. 5 a cross-sectional view of an impact switch, generally designated 45, embodying the present invention is illustrated. Switch 45 is illustrated having a housing 46 which is the same shape housing as utilized in the prior art solely to demonstrate that the present invention can replace existing prior art switches. Housing 46 contains an impact sensor 47 having a layer of plastic 48 located above it. A printed circuit board 49 is located in plastic 48. It should be noted here that printed circuit board 49 may be placed with impact sensor 47 if desired. Above plastic 48 is a preset screw 50 which sets the preload pressure of the device. In this configuration a shock wave represented by arrow 51 will reach sensor 47 before the shock wave through plastic 48. This makes switch 45 non-critical to temperature since plastic 48 does not transmit the triggering shock wave. In addition the preload pressure exerted by 10 preset screw 50 will not effect the present invention as no pressure is exerted on impact sensor 47.

Thus, it is apparent that there has been provided in accordance with the invention, a device and method that fully satisfies the objects, aims and advantages set forth above.

It has been shown that the present invention provides an impact switch and method of operation that is non-critical to temperature and preload pressure. It has further been shown that the present invention provides an impact switch that has a low profile and has adjustable impact load settings.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

We claim:

1. An impact switch having an electrical input and an electrical output, said impact device comprising:
- a conductive center plate having an opening disposed therethrough, said conductive center plate being coupled to one of said electrical input and electrical output of said impact device;
- a conductive beam having a first end and a second end opposite said first end, said conductive beam being disposed in the opening of said conductive center plate and said first and second ends being coupled to said conductive center plate;
- a conductive mass being coupled to said conductive beam;
- a conductive top plate having a groove disposed therein, said conductive top plate being coupled to said conductive center plate such that the groove of said conductive top plate is disposed above the opening of said conductive center plate, said conductive top plate being coupled to the remaining one of said electrical input and electrical output of said impact device;
- an insulating layer being disposed between said conductive center plate and said conductive top plate; and
- a conductive pin extending through said conductive top plate and into the groove of said conductive top plate such that when said conductive beam flexes said conductive mass will come into contact with the said conductive pin.

2. The impact device of claim 1 further comprising a bottom plate having an adjusting opening disposed therethrough, said bottom plate being coupled to said conductive center plate opposite said conductive top plate such that the adjusting opening of said bottom plate is disposed below said conductive mass.

3. An impact device having an electrical input and an electrical output, said impact device comprising:
- a conductive bottom plate having an opening disposed therethrough, said conductive bottom plate being coupled to one of said electrical input and electrical output of said impact device;
- conductive contact means for connecting said electrical input and electrical output of said impact device, said conductive contact means having a first end and a second end opposite said first end, said conductive contact means being disposed in the opening of said conductive bottom plate and said first and second ends being coupled to said conductive bottom plate;
- an insulative center plate having an opening disposed therethrough, said insulative center plate being coupled to said conductive bottom plate such that the opening of said insulative center plate is disposed over the opening of said conductive bottom plate; and
- a conductive top plate being coupled to said insulative center plate opposite said conductive bottom plate, said conductive top plate being coupled to the remaining one of said electrical input and electrical output of said impact device.

4. The impact device of claim 3 wherein said contact means comprises a conductive beam having a first end and a second end opposite said first end, said conductive beam being disposed in the opening of said conductive bottom plate and said first and second ends being coupled to said conductive bottom plate; and a conductive mass being coupled to said conductive beam such that when said conductive beam flexes from sufficient external forces said conductive mass will contact said conductive top plate.

5. The impact device of claim 4 further comprising a conductive pin extending through said conductive top plate and into the opening of said insulative center plate.

6. The impact device of claim 5 further comprising:

a cylindrical housing having a base and a threaded top, said housing containing said bottom, center and top plates being disposed at the base of said housing;

a plastic layer being disposed above said top plate in said cylindrical housing;

a printed circuit board being disposed in said plastic layer; and a preset screw being threadedly inserted into said threaded top of said housing.

7. An impact device having an electrical input and an electrical output, said impact device comprising:

a conductive center plate having an opening disposed therethrough, said conductive center plate being coupled to one of said electrical input and electrical output of said impact device;

conductive contact means for connecting said electrical input and electrical output of said impact device, said conductive contact means having a first end and a second end opposite said first end, said conductive contact means being disposed in the opening of said conductive center plate and said first and second ends being coupled to said conductive center plate;

a conductive top plate being spaced a predetermined distance above said conductive center plate and said conductive top plate being coupled to the remaining one of said electrical input and electrical output of said impact device; and an insulative layer being disposed between said conductive center plate and said conductive top plate.

8. The impact device of claim 7 wherein said contact means comprises:

a conductive beam having a first end and a second end opposite said first end, said conductive beam being disposed in the opening of said conductive bottom plate and said first and second ends being coupled to said conductive bottom plate; and a conductive mass being coupled to said conductive beam such that when said conductive beam flexes from sufficient external force said conductive mass will contact said conductive top plate.

9. The impact device of claim 8 further comprising a conductive pin extending through said conductive top plate above said conductive contact means.

10. The impact device of claim 9 further comprising a bottom plate having an adjusting opening disposed therethrough, said bottom plate being coupled to said conductive center plate opposite said conductive top plate such that the adjusting opening of said bottom plate is disposed below said conductive contact means.

11. An impact switch, comprising:

a conductive center member;

a conductive top member;

conductive flexible beam means coupled to said conductive center member for engaging said conductive top member when said impact switch is impacted;

an insulating layer being disposed between said conductive center member and said conductive top member; and a bottom member having an adjusting opening disposed therethrough, said bottom member being coupled to said conductive center member opposite said conductive top member such that the adjusting opening of said bottom member is disposed below said conductive flexible beam means.

12. The impact switch of claim 11 further comprising a conductive pin being disposed in said conductive top member which is contacted by said conductive flexible beam means on impact.

13. The impact switch of claim 12 further comprising a bottom member having an adjusting opening disposed therethrough, said bottom member being coupled to said conductive center member opposite said conductive top member such that the adjusting opening of said bottom member is disposed below said conductive flexible beam.

14. The impact device of claim 11 further comprising a conductive mass being coupled to said conductive flexible beam means for engaging said conductive top member when said impact switch is impacted.

* * * * *